United States Patent [19]

Ryan

[11] 3,965,469
[45] June 22, 1976

[54] ANNUNCIATOR STRUCTURE AND METHOD

[75] Inventor: Thomas J. Ryan, Olmstead Falls, Ohio

[73] Assignee: The North American Manufacturing Company, Cleveland, Ohio

[22] Filed: July 30, 1974

[21] Appl. No.: 493,038

[52] U.S. Cl. ............................. 340/415; 340/336
[51] Int. Cl.² ........................................ G08C 1/00
[58] Field of Search ........................... 340/415, 412

[56] References Cited
UNITED STATES PATENTS

| | | | |
|---|---|---|---|
| 3,603,986 | 9/1971 | Harris | 340/415 |
| 3,727,205 | 4/1973 | Scourtes | 340/415 |
| 3,872,473 | 3/1975 | Melgaard | 340/415 |

Primary Examiner—Thomas B. Habecker
Attorney, Agent, or Firm—Whittemore, Hulbert & Belknap

[57] ABSTRACT

Structure for and a method of determining which of a plurality of switches in a series circuit first opens after the circuit has initially been completed, for determining line voltage failure to the series circuit, and for monitoring open switches in the series circuit on start-up, comprising means for and the steps of sensing line voltage failure and the condition of each of the switches and providing sensed signals in accordance therewith, converting the sensed signals into coded output signals representative of the desired information relative to switch and line voltage conditions, and subsequently decoding the coded signals and driving a digital display device therewith to provide a visual readout of line voltage and switch condition. Provision is made for manually decoding the coded signals and providing a display in accordance therewith whereby the first fault in the series circuit prior to the circuit having been completed may be determined. Delaying the decoding and driving of the display device until the information relative to the line voltage and switch condition has been latched into the decoding means is also provided for. Extending the range of the annunciator by multiplexing or cascading circuits is also disclosed.

5 Claims, 6 Drawing Figures

STATE OF INPUTS INTO PRIORITY ENCODER

ANNUNCIATOR STRUCTURE AND METHOD

BACKGROUND OF THE INVENTION

1. Field of the Invention

The invention relates to annunciators and refers more particularly to a circuit for and a method of providing a digital indication of the condition of line voltage and switches in a series circuit including structure for and the steps of sensing the series circuit before the first and subsequent to each switch, and providing separate electronic logic level signals in response to the voltage at the sensed points in the series circuit, encoding the output signals to provide a digital signal representative of the first point at which voltage was lost, and subsequently decoding the encoded signals to provide an output signal for driving a digital display device providing an indication of the point of fault.

2. Description of the Prior Art

In the past, structure for determining which of a plurality of switches in a series circuit has opened first has often been complicated and expensive and sometimes inefficient. Further, such circuits in the past have not always provided a definite indication of which switch opened first and/or a definite indication of line voltage failure. Also, the prior circuits have usually not provided a ready method for ascertaining which is the first open switch in the series circuit prior to the circuit initially being completed. Often, the annunciators of the past have not provided a direct digital readout or have not been fail-safe. Such structures have also often sensed impulses across a switch rather than merely monitoring the signal at the switch which has been undesirable.

SUMMARY OF THE INVENTION

The annunciator of the invention includes a plurality of separate sensing circuits connected to a series circuit including a plurality of series connected switches, which sensing circuits are connected between each of the series connected switches and between the first switch in the series circuit and a source of electrical energy and between the last switch in the series circuit and the circuit load, which sensing circuits provide logic level voltages representing the condition of the line voltage and the switches in the series circuit. The logic level signals are then encoded in a priority encoder to provide a binary coded output signal representing the condition of the line voltage and the switches in the series circuit. The binary coded signal is then passed through a decoder-driver where it is decoded and used to drive a digital display device to provide a digital indication of a power failure or the first switch open in the series circuit.

A time delay is provided in the sensing circuit between the last switch in the series circuit and the load to ensure latching the decoder-driver onto signals from the priority encoder representing the true condition of the line voltage and switches at the time of breaking of the series circuit after initial completion of the series circuit. The same sensing device provides an indication on the digital display device of line voltage at the load in the series circuit.

The annunciator of the invention further includes manual means for actuating the decoder-driver whereby line voltage failure and individual switches which have failed to close on initial attempt to close the series circuit may be sequentially indicated on the digital display device.

A number of modifications of the sensing circuits are disclosed. Each of the embodiments of the sensing circuits disclosed includes structure operable to emit light in response to a circuit condition and light-sensitive resistive means for changing logic level voltages in response to the light-emitting devices being energized and deenergized.

Eight and fifteen switch annunciators are described in detail. Expansion of the number of switches the annunciator is capable of monitoring may be accomplished by either multiplexing priority encoders or cascading them in accordance with the invention.

DESCRIPTION OF THE PREFERRED EMBODIMENTS

Figure 1:
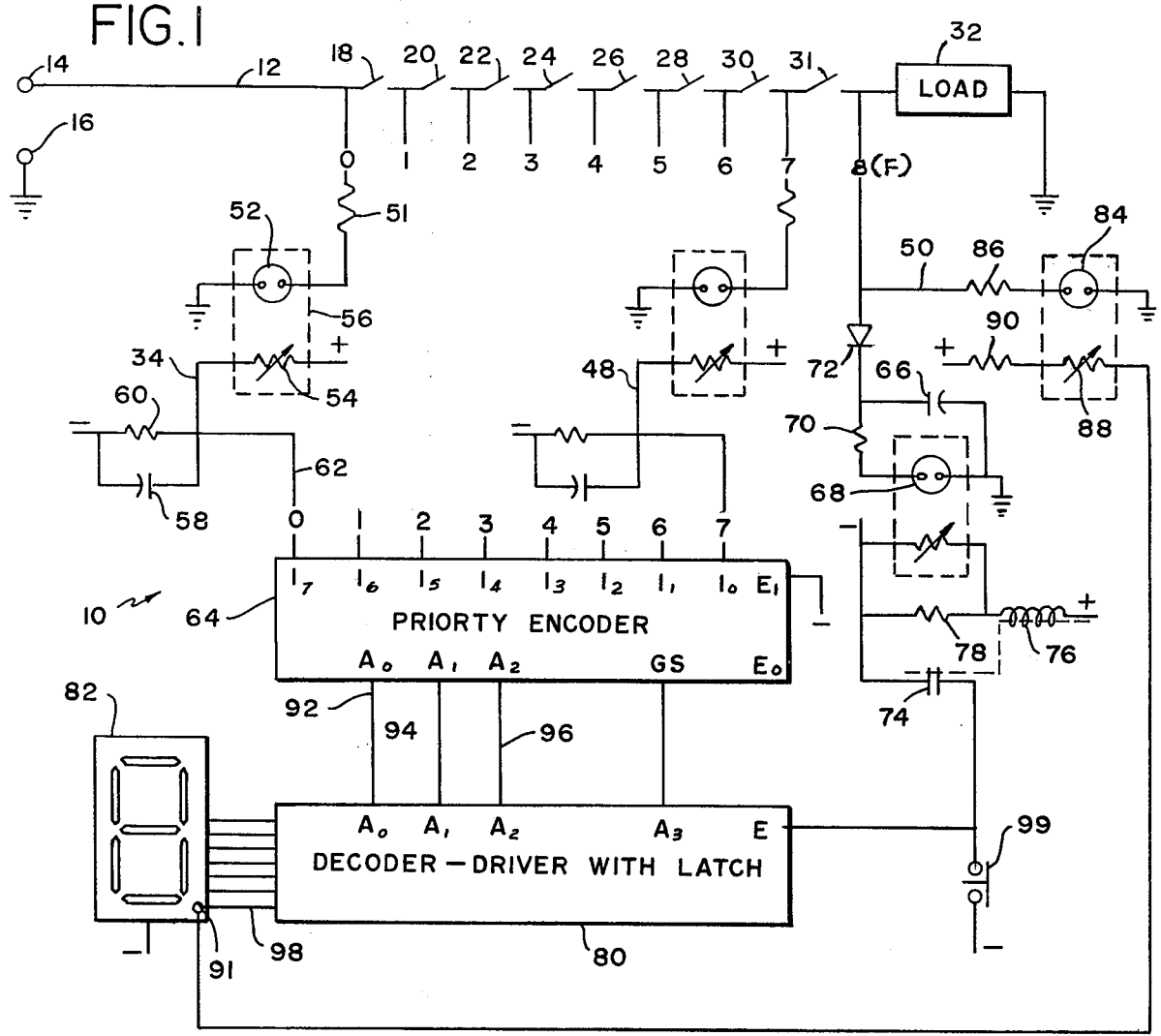
FIG. 1 is a partly schematic, partly block diagram of the annunciator of the invention.

The annunciator 10 illustrated in detail in FIG. 1 is shown connected to a series circuit 12 extending from one side 14 of a voltage input having the sides 14 and 16 with with side 16 being electronic common or ground. The voltage may be the usual 120-volt, 60-cycle service supplied in the United States. The series circuit 12 further includes a plurality of separate switches 18, 20, 22, 24, 26, 28 and 30 which may be relay contacts, mechanical interlocks, limit switches, or the like. The circuit 12 is completed through the switch 31 and load 32 back to the side 16 of the input circuit. The load 32 may, of course, be any load such, for example, as a solenoid on a safety valve, or the like.

Separate sensing circuits 34, 36, 38, 40, 42, 44, 46 and 48 are provided in the annunciator circuit 10 to monitor the condition of the circuit at the points shown. Thus, the line voltage is monitored by the sensing circuit 34 and the individual switch circuits 18 through 30 are monitored by the sensing circuits 36 through 48. The switch 31 and circuit 50 further monitor the existence of line voltage at the load 32 since the circuit 50 is connected between the switch 31 and the load 32. Circuit 50 also provides a trigger signal for the decoder-driver 80.

Each of the sensing circuits 34 through 48 are identical; therefore, only the circuit 34 will be considered herein in detail.

The sensing circuit 34 includes the resistor 51 and the neon bulb 52 connected in series between the side 14 of the line voltage of the circuit to be monitored and the side 16 thereof, as shown. The neon light bulb will thus be energized when the line voltage is present.

A photocell 54 including resistive means which varies in accordance with whether or not light shines on the photocell is positioned in an enclosure 56 so as to shield the photocell 54 from light other than that emitted from the neon bulb 52. The photocell 54 is connected in series with a source of electrical energy and a parallel connected capacitor 58 and a further resistor 60 as shown in FIG. 1.

The output signal from the sensing circuit 34 on the conductor 62 is thus varied between 0.5 volts when the neon bulb 52 is not energized and 3 volts when the neon bulb is energized, with approximately 5 volts applied across the series circuit of the variable resistance of the photocell 54 and the parallel combination of the resistor 60 and capacitor 58.

Thus, with the annunciator circuit of FIG. 1, from the sensing circuits 34 through 48 there will be provided at the priority encoder 64 eight separate signals which will be either 0.5 volts or 3 volts, depending on whether there is a line voltage present and which of the switches 18 through 30 are open.

Figure 5:
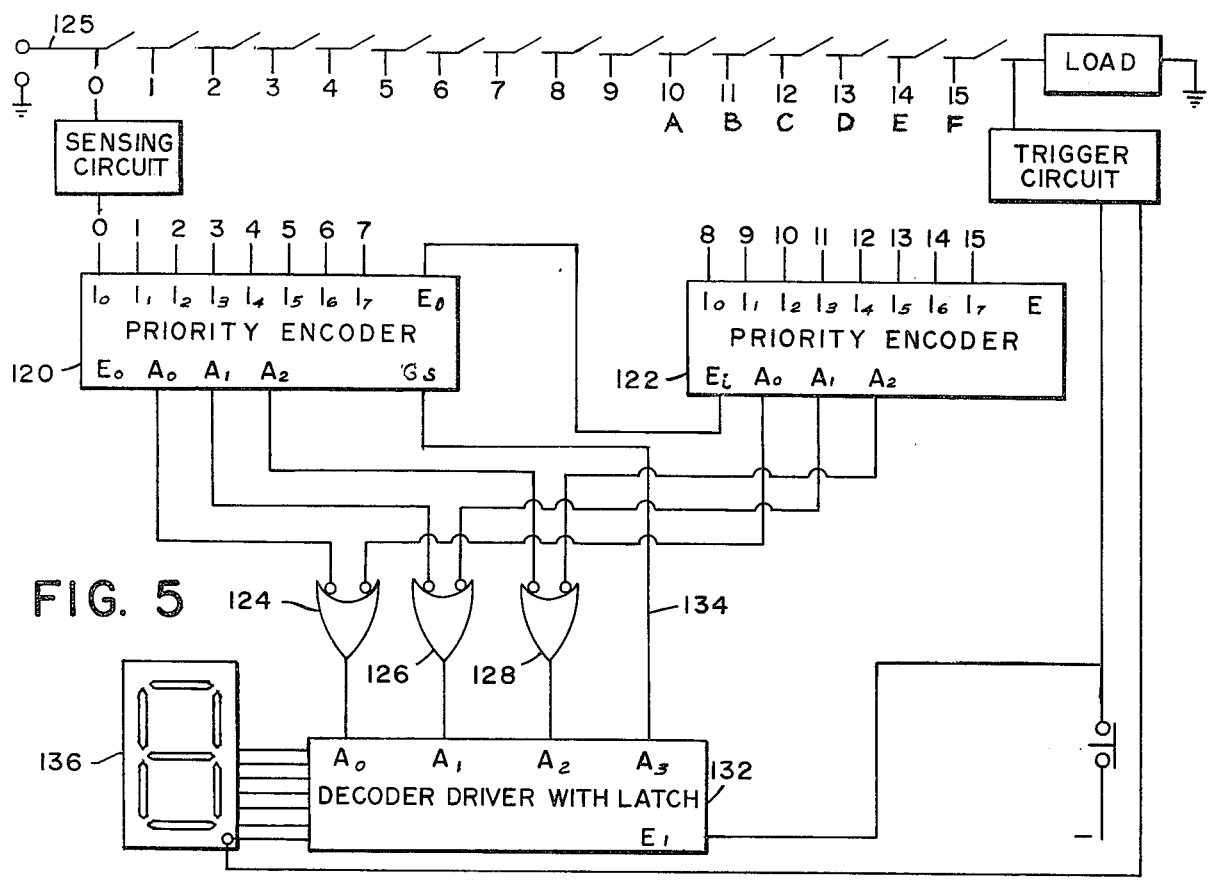
FIG. 5 is a partly schematic and partly block diagram of an annunciator constructed in accordance with the invention, including cascaded encoding structure for extending the range of the annunciator.

Considering the 0.5 volts to be a zero logic level and 3 volts to be a one logic level, the state of the inputs to the priority encoder will be as shown in FIG. 5 with the sensing circuits corresponding to the various switches open shown at the left. That is to say, for example, on line power failure, none of the neon bulbs in the sensing circuits will be energized and therefore the output from the sensing circuits 34, 36, 38, 40, 42, 44, 46 and 48 will be a zero logic level.

The sensing circuit 50 is different from the sensing circuits 34 through 48 in that a capacitor 66 is provided to cause the neon light 68 in series with the resistance 70 to remain lit for a predetermined time after the circuit 12 has been broken. Thus, the capacitor 66 circulates the energy stored in the capacitor through the neon light 68 for a predetermined time after breaking of the circuit 12. The additional time during which the sensing circuit 48 provides an output signal holds the contacts 74 of relay 76 in series with the resistor 78 energized, so that the trigger signal to the decoder-driver 80, to be considered later, will not be cut off prior to the latching of the decoder-driver to lock the signal received thereby from the priority encoder into the decoder-driver and thus maintain the correct digital display on the digital display device 82.

Also in the sensing circuit 50 there is a neon light 84 which is energized through the resistor 86 to vary the resistance of the photocell 88 in combination with the resistor 90 to provide power to the digital display device 82 whereby a decimal point 92 is present on the digital display device to indicate switch 31 is closed and that there is line voltage present at the load 32.

The eight signals presented to the priority encoder 64 in the reverse of the usual order of signals presented to a priority encoder are placed in a code such as the binary code having highest priority 0, next 1, and then 2, and so on, which binary code is provided as an output to the decoder-driver 80 over the conductors 92, 94 and 96. In the binary code, a maximum of eight digits from zero to seven may be represented on the three conductors 92, 94 and 96. An F is also provided in place of 8.

Priority encoders capable of encoding signals as indicated in FIG. 5 into a binary code as indicated above are well known and will not, therefore, be considered in detail herein. One such device is available as an off-the-shelf item from the Semi-Conductor Components Group, Fairchild Camera and Instrument Corporation, Mountain View, Calif., as their TTL/MSI 9318 Eight-Input Priority Encoder. Other such devices are within the skill of the art to construct.

The binary coded signal from the priority encoder 64 is inserted into the decoder-driver 80 so as to provide a 7-conductor output on the conductors 98 which in conjunction with the digital display device 82, which is a seven-segment diode readout device, provides a digital display of the switch which has first been open after the circuit 12 is initially closed. If there is no line voltage in the circuit 12, the digital indicator will indicate zero.

Again, devices such as the decoder-driver 80 (TTL/MSI 9368) and the diode readout device 82 (FND-70) are available through the Fairchild Corporation and are within the capabilities of those skilled in the art to construct and will not, therefore, be considered in further detail herein.

In overall operation of the annunciator of the invention, to perform the method of the invention, the annunciator structure 10, as shown in FIG. 1, may be connected to a set of series switches, as shown, and the line voltage turned on. If all of the switches 18, 20, 22, 24, 26, 28, 30 and 31 are closed, the line voltage will be at the load 32 to, for example, energize a safety valve relay which if deenergized will, for example, cause a safety valve to open.

While the load 32 is energized, its energization is indicated by the F and the decimal point 91 on the digital display device 82. Should any of the switches 18, 20, 22, 24, 26, 30 or 31 subsequently open or should the line voltage fail, the sensing circuits 34 through 48 would provide a logic pattern as shown in FIG. 6.

Figure 6:
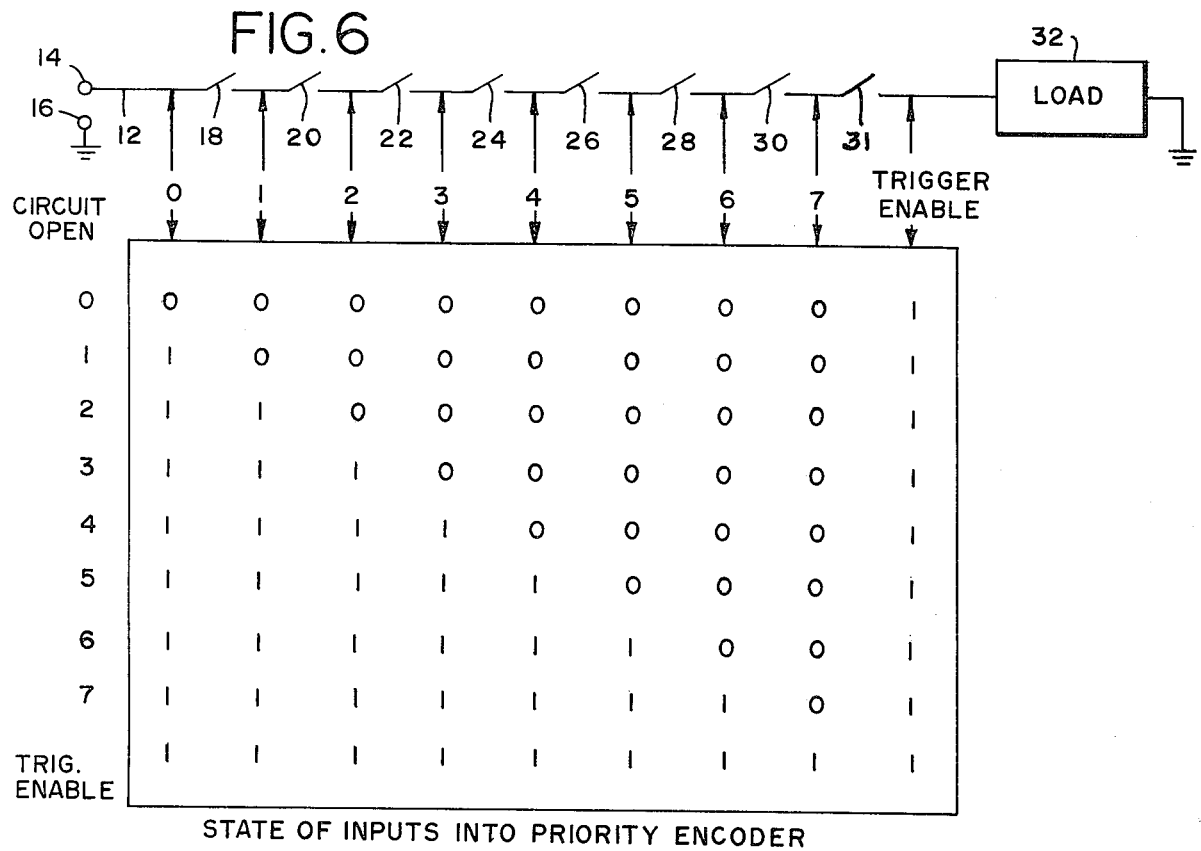
FIG. 6 is a diagram illustrating the logic signal level of the signals from the sensing devices of the annunciator of the invention with the switches and line voltage in various conditions at a time after the circuit was initially completed and before the time delay associated with the trigger signal has elapsed.

Thus, for example, if the second switch; i.e., switch 20, opened, the signal outputs from the sensing circuits 36 through 48 would be as indicated in the third line down in FIG. 6 so that the two inputs $I_6$ and $I_7$ would be logic 1's, while the inputs $I_0$ through $I_5$ in FIG. 1 would be logic zero's. The trigger signal would initially be a logic 1. The trigger signal would be maintained from the capacitor 66 in the sensing circuit 50 for a time sufficient for the decoder-driver 80 to latch onto the 2 indication which would be provided from the priority encoder 64 to the decoder-driver, after which the signal from the sensing circuit 50 would also drop to zero. The digit 2 would then be presented on the digital display device 82. This would indicate that the switch 20 was the first switch to open so that maintenance activity could be concentrated in the area of switch 20.

On initial start-up, should the decimal point 92 fail to appear on the digital display device 82, the manual push button 99 may be pressed to provide a trigger signal to the decoder-driver 80 so that the first switch which is open will be indicated on the digital display device 82. After the difficulty with the closing of that switch has been found, the manual push button may again be pushed to indicate which is the next switch opened. This procedure may be continued until the decimal point 92 appears on the device 82 whereby it is assured that the circuit is closed and the load 32 is energized.

Thus, it will be seen that the annunciator of the invention is particularly advantageous in that it provides a digital readout which can distinguish between power failure and individual switch failure, and that individual switches which have not been closed may be monitored on initial start-up. Further, the annunciator circuit of the invention is fail-safe. It will also be noted that the annunciator circuit of the invention does not monitor impulses across the switches, but merely samples voltages in the system.

Figure 2:
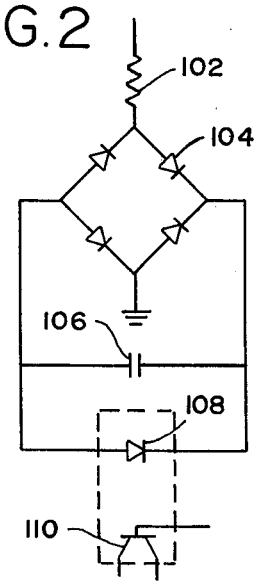
FIG. 2 is a schematic diagram of a modified sensing circuit for use in the annunciator of FIG. 1.
Figure 3:
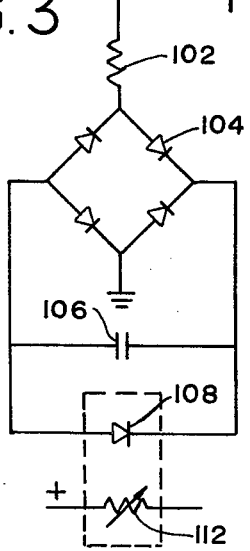
FIG. 3 is a schematic diagram of another modified sensing circuit for use with the annunciator of FIG. 1.
Figure 4:
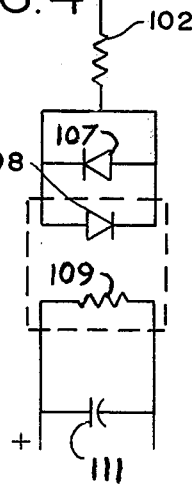
FIG. 4 is a schematic diagram of still another modified sensing circuit for use with the annunciator of FIG. 1.

The sensing circuits 34 through 48 may alternatively be as shown in FIGS. 2 through 4. In FIG. 2, the sensing circuit includes a resistor 102, a full-wave rectifier 104, a capacitor 106 and a light-emitting diode 108 associated as shown to a light-sensitive transistor 110, the resistance of which varies in accordance with light provided from the diode 108 when it is energized from circuit 12 as before. In FIG. 3, a photocell 112 is substituted for the light-sensitive transistor 110 to again provide a varied logic level output depending on whether the light-emitting diode 108 is energized or not. In FIG. 4, the diode rectifier 107 feeds the light-emitting diode 108 which causes a change in the resistance of the light sensitive resistor 109 connected in parallel with capacitor 111. Other sensing devices could be substituted for devices 34 through 48 as shown in FIG. 1.

Further, it will be understood that the range of the annunciator of the invention may be expanded to include substantially any practical number of series switches by means of multiplexing a plurality of priority encoders or by cascading priority encoders as shown particularly in FIG. 5.

The cascading circuit illustrated in FIG. 5 is particularly advantageous when it is desired to monitor up to fifteen switches. In FIG. 5, two separate priority encoders 120 and 122 are connected to the series circuit 125, as before. Three gates 124, 126 and 128, which may be a Fairchild TTL/MSI 9N08, are connected between the priority encoders 120 and 122 and the decoder-driver 132, as shown. Thus, the three signals out of the priority encoder 120 are again digitally coded and provide output signals between the gates 124, 126 and 128 which will provide 0 to 7 indications as before.

A signal on the conductor 134 with associated outputs from $A_0$, $A_1$ and $A_2$ of 120 will indicate an 8-count. The subsequent counts from the priority encoder 122 will then provide counts from 9 through 15.

The output from the decoder-driver 132 may then provide numerals from 0 to 9 in a specific function one digit readout digital display device 136. The last five readouts from the device 136 may then be in letters such as A through F representing digits 10 through 15.

Expansion beyond 15 switches would warrant an extra digital display device permitting expansion up to 99 switches using two digits. Such expansion could be augmented by changing the first digiting in such a system to letters A through Z. The 99-switch capacity could be raised to 27 × 9 or 243 switches.

While one embodiment of the invention and modifications thereof have been considered in detail herein, it will be understood that other embodiments and modifications are contemplated by the inventor. It is the intention to include all such embodiments and modifications as are defined by the appended claims within the scope of the invention.

What I claim as my invention is:

1. Annunciator structure for monitoring a series circuit including a plurality of series connected switches and having a terminal between each switch and for providing a visual indication of which of the switches first opened after the circuit has initially been completed, comprising a separate sensing circuit associated with each of the swithces connected between a separate one of said terminals and a common potential operable to provide a predetermined logic signal output pattern in response to a predetermined pattern of closure of the switches, encoding means for converting the predetermined pattern into a coded signal representative of a designation of the first of the switches to open, and means for decoding the signal and for providing a display indicating which of the switches opened first including delay storage means for latching said decoding means to provide an indication of a particular switch being first to open and to prevent opening of subsequent switches from affecting the display.

2. Structure as set forth in claim 1 and further including means for sensing power failure in the series circuit and providing an output indication representative thereof.

3. Structure as set forth in claim 1 and further including manual means for actuating the decoding means, latching means to display the first switch not closed before the initial completion of the series circuit on manual actuation thereof.

4. Structure as set forth in claim 1 wherein the sensing circuit is connected to the series circuit immediately before the adjacent associated load and includes a light-emitting device operable to produce light energy in response to closing of the associated switch and a light-sensitive resistance element positioned adjacent the light-emitting device and isolated from other light-emitting devices whereby opening of the associated switch will produce a change in the resistance element.

5. Structure as set forth in claim 1 and further including a plurality of the encoding means and logic means for combining the outputs of the encoding means to permit monitoring of any selected number of series connected switches.

\* \* \* \* \*